United States Patent [19]

Swamy et al.

[11] Patent Number: 5,613,033

[45] Date of Patent: Mar. 18, 1997

[54] LAMINATED MODULE FOR STACKING INTEGRATED CIRCUITS

[75] Inventors: N. Deepak Swamy; Tom J. Kocis, both of Austin, Tex.

[73] Assignee: Dell USA, LP, Austin, Tex.

[21] Appl. No.: 374,275

[22] Filed: Jan. 18, 1995

[51] Int. Cl.$^6$ .............................. H01R 23/72; H01R 9/09; H05K 1/11; H05K 7/02
[52] U.S. Cl. ......................... 361/790; 361/735; 361/790; 361/792; 361/777; 361/803; 439/65; 439/75; 439/83
[58] Field of Search ..................... 29/741, 845; 174/250, 174/253, 255, 260, 261, 262, 263; 228/180.21, 180.22, 179.1, 180.1; 257/686, 723, 724, 727, 737, 738, 773, 772, 778, 779, 786; 361/735, 743, 744, 745, 760–762, 764, 767, 768–772, 774, 777, 779, 783, 784, 785, 790–795, 803; 437/208, 209, 915; 439/44–45, 55, 65, 66, 68, 69, 74, 75, 76, 83

[56] References Cited

U.S. PATENT DOCUMENTS

| | | | |
|---|---|---|---|
| 4,696,525 | 9/1987 | Coller et al. | 439/69 |
| 4,707,657 | 11/1987 | Boegh-Petersen | 439/66 |
| 4,882,657 | 11/1989 | Braun | 361/790 |
| 4,954,878 | 9/1990 | Fox et al. | 361/769 |
| 5,031,308 | 7/1991 | Yamashita et al. | 361/795 |
| 5,038,467 | 8/1991 | Murphy | 29/845 |
| 5,376,825 | 12/1994 | Tukamoto et al. | 361/684 |
| 5,464,682 | 11/1995 | Perfecto et al. | 361/767 |

FOREIGN PATENT DOCUMENTS

| | | | |
|---|---|---|---|
| 2673040 | 8/1992 | France | 257/686 |
| 3316017 | 11/1984 | Germany | 439/83 |
| 63-254760 | 10/1988 | Japan | 257/686 |
| 63-249362 | 10/1988 | Japan | 257/686 |
| 3-11645 | 1/1991 | Japan | 437/215 |
| 3-250757 | 11/1991 | Japan | 257/686 |

OTHER PUBLICATIONS

IBM Technical Discloure Bulletin "Packaging Techniques" by Hinkley et al. vol. 9 No. 7 pp. 765 Dec. 1966.
IBM Technical Discloure Bulletin "Packaging Integrated Circuit" by Ross vol. 13 No. 9 p. 2761 Feb. 1971.
IBM Technical Discloure Bulletin "Increased Useable I/O Pins On A Substrate" by Holsopple et al vol. 23 No. 7A pp. 2716 and 2717 Dec. 1980.
IBM Technical Discloure Bulletin "High Performance Multi–chip Module" vol. 30 No. 6 pp. 437–439 Nov. 1987.

*Primary Examiner*—Donald Sparks
*Attorney, Agent, or Firm*—Skjerven, Morrill, MacPherson, Franklin and Friel; Stephen A. Terrile

[57] ABSTRACT

An interconnect system is provided in which one or more laminated modules embodying electrical devices can be stacked in a three dimensional configuration upon a printed circuit board. One or more electrical devices is surface mounted to a recessed area at the upper surface of each laminated module, and each laminated module includes male pins and female sockets. The male pins can be releasibly engaged within sockets upon a printed circuit board. Additionally, the male pins of one laminated module can be engaged within female sockets of another laminated module in building-block fashion. Conductive paths are formed entirely through the laminated module between respective sockets and pins. The conductive paths are arranged in a less dense fashion than bond locations adjacent each electrical device. The bond locations are therefore offset from conductive paths to provide fan-out and redistribution features.

8 Claims, 3 Drawing Sheets

LAMINATED MODULE FOR STACKING INTEGRATED CIRCUITS

BACKGROUND OF THE INVENTION

1. Field of the Invention

This invention relates to an interconnect structure and more particularly to one or more laminated modules placed on a printed circuit board for interconnecting signals sent between the printed circuit board and integrated circuits arranged on the laminated modules.

2. Background of the Relevant Art

Printed circuit boards (PCBs) or printed wiring boards (PWBs) are rigid or flexible single, double or multilayered boards having printed conductors placed upon or within the board material. A PCB is designed to receive separately manufactured electrical devices and to interconnect those devices into an overall circuit structure. The devices comprise integrated or discrete circuits well known in the semiconductor art.

PCBs are manufactured by subtractive or additive processes from rigid copper-clad, epoxy-impregnated glass fiber laminate or phenolic-impregnated paper. Regardless of the base material used or the process by which printed conductors are formed, the desired outcome of PCB manufacture remains the same: to produce a dielectric structure having densely patterned printed wires arranged upon the dielectric outer surface or at one or more layers within the dielectric. The resulting overall structure provides a reliable mechanical and electrical support for devices arranged thereon.

The technology used in forming a PCB as well as a packaged device arranged thereon has evolved over time. Initially, most devices were packaged in metal, glass and/or plastic material having one or more leads extending in a singular direction from one or two surfaces of the package. The leads of a dual in-line package (DIP), for example, extend in a downward direction from opposing surfaces of the package. The downward extending leads can then be connected to PCB by inserting the leads into sockets or metal eyelets formed within the PCB.

Early device packages incorporate leads of relatively large cross section into relatively large metal eyelets and/or sockets. More recent advances have given way to a more densely patterned interconnect scheme using smaller cross-sectional leads placed within plated-through holes (PTHs). PTHs are patterned at small pitch distances across the PCB in registry with more densely spaced, smaller cross-sectional leads. PTH technology provides an important advancement in the fabrication of multilayer PCBs. Internal conductors within the PCB are interconnected with external conductors and with device leads using plated holes or vias extending therebetween. Holes are drilled at various points throughout the PCB where device leads are to be inserted or where internal signal lines are to be connected. The inside walls of the holes are coated with copper by electroless deposition. Thereafter, the copper plating is covered with a lead-tin solder. During wave soldering, molten solder is drawn up around the leads by capillary action to form a secure bond. PTHs are easier and less costly to form than metal eyelets and can receive densely patterned electrical leads of smaller cross section. Accordingly, PTHs allow miniaturization of device-to-PCB interconnect.

More recently, PTH techniques have, in some respects, given way to an even more dense interconnect scheme often referred to as surface mount technology. Instead of drilling holes through the PCB and placing device leads through the plated holes, surface mount pads are formed on the PCB surface only, and are configured to receive leads from a surface mount device. While PTH leads are smaller than leads inserted into metal eyelets or sockets, PTH leads must nonetheless be large enough to withstand the rigors of insertion. Since they need not be inserted into a hole, surface mount leads can be made much smaller and can be placed at an even finer pitch.

While surface mount and PTH technologies provide density and cost advancements over plug and socket techniques, there remains many applications in which surface mount pads and PTHs cannot be used. For example, many instances dictate that the device be temporarily placed into the PCB. PTH and surface mount pads require wave soldering and the implications of permanent interconnect at the solder points. After the device is soldered to the PCB using PTH or surface mount techniques, the device can no longer be easily removed in the field without significant rework. It is therefore desirable to have a plug and socket interconnect configuration in situations where the device is capable of being simply removed by frictional disengagement and replaced with another device.

Replacement of devices has gained popularity in the areas of memory and microprocessors. If a memory or microprocessor device is defective, it is desirous to remove the device from the retaining sockets and replace it with a viable device. Additionally, device upgrade is generally afforded in instances where the upgrade device is pin-for-pin compatible with the previous device. Such is the case in many X86 compatible microprocessors and high density DRAMs.

Replacement and retrofittability may often entail stacking of devices upon a PCB. In parallel processor applications, many I/O pins are shared by processors and executed in parallel by a grouping of processors placed across a printed circuit board. If a processor device is defective, it would be desirable to remove the defective processor and replace it using a plug and socket interconnect scheme. More importantly, it would be desirable to minimize the total PCB area necessary to interconnect the parallel-connected processors with the PCB. Still further, it would of benefit to add additional processors to the PCB without having to redesign or relayout the PCB.

With the increased popularity of parallel processing and the need for primary memory add-on, there is an emphasis on stacking such devices, as well as other types of devices, upon a PCB to minimize PCB interconnect area. Stacking electrical devices upon a PCB is well known. An exemplary stacking design using a surface mount PCB with small outline (SO) DIP packages is illustrated in U.S. Pat. No. 4,696,525. Patent '525 discloses a socket for interconnecting or stacking SO-type DIP devices to surface mount pads arranged on a PCB. While U.S. Pat. No. '525 illustrates stacking capability, at least one device, i.e., the lowermost device, must remain permanently fixed to the PCB. Any subsequently stacked devices in Patent '525 are generally soldered to the socket. Permanent attachment does not allow ease of replacement or retrofittability. If, for example, the lower device is defective, the interconnect joint must be reworked (e.g., heated) to release the device from its soldered position. The same applies for any overlying, stacked devices soldered to corresponding socket leads.

Field replaceability and retrofittability of a device arranged anywhere within the stack is an important feature generally lacking from conventional interconnect structures. Further lacking is the capability of connecting high density leads of one device to another device and further to a PCB. In high performance microprocessors one hundred or more leads are often used. It is important that each lead be channeled from one device to another device and to the PCB using a stacked configuration and without fear of the leads being misaligned during placement.

SUMMARY OF THE INVENTION

The problems outlined above are in large part solved by an interconnect system for releaseably connecting one or more electrical devices in a stacked configuration upon a PCB. The interconnect system entails one or more laminated modules interspersed between one or more electrical devices, wherein the laminated modules and electrical devices are stacked in a columnar configuration in an axis perpendicular to the PCB. Each laminated module has opposed surfaces. One surface includes a plurality of sockets and the opposed, other surface includes a plurality of pins.

In order to build an interconnect system, the pins of an laminated module are plugged either into corresponding sockets within a PCB or into sockets on another laminated module. On the same surface of the laminated module having sockets, an area is formed upon which a non-packaged electrical device can be placed. Non-packaged electrical device is defined herein as a scribed die taken from a semiconductor wafer. Each die includes terminal ends of circuitry adapted to bond with a wire extending from the die circuitry to bond locations upon the laminated module. The bond locations are arranged, for example, as a series of half-sphere conductive elements formed on the surface of an exposed layer beneath the outer surface of the laminated module and, more particularly, beneath the outer surface on which the terminal ends of sockets are arranged. The bond locations are connected by trace elements to conductive paths formed between respective sockets and pins. Accordingly, the conductive paths are formed by solder connection necessary to produce connectivity between the sockets and corresponding pins.

Connectivity of the pins to corresponding sockets is performed by connecting an intermediate device between a female component and a male component. The female component is preferably square with an opening through the middle of the card. The opening resides over the area which receives a non-packaged electrical device, wherein sockets are placed through the female component with socket openings extending outward from one face of the female component. The intermediate component includes two opposing sides, and a plurality of spaced vias extending through the intermediate component and terminating at the opposing sides. Termination of the vias is at a position offset from a plurality of bonding pads. Bonding pads arranged upon one of the opposing sides of the intermediate component functions as bond locations for receiving wires extending from die circuitry, while bonding pads at the other opposing surface are arranged in registry with pins formed through a male component. The male component includes two opposite sides, wherein one side has bonding pads which mate with the intermediate component bonding pads, while the opposite side has pins which extend outward from the exposed surface.

The female component surface not having open sockets and the male component surface not having protruding pins are brought in registry with bonding pads and bond locations formed on the outer opposed surfaces of the intermediate component. After the bonding pads are brought in contact, reflow methods such as infrared (IR) or vapor phase heating are suitable to adjoin the solder at the bonding pads thereby forming a unibody laminated module comprising a female component, an intermediate component and a male component coupled together.

A preferred aspect of the present invention is rework capability within the intermediate component. Any changes to the pin out configuration of an electrical device can be effectuated by connection to vias extending throughout the intermediate component. The connection vias function not only as pass-through vias extending through the intermediate component but also as reroute vias between signal lines formed at one or more levels within the intermediate component. The signal lines are generally coplanar in one or more levels and can connect to the vias using PTH techniques. The vias can therefore extend entirely through the intermediate component or as buried vias between interim levels within the card. Signal line redistribution allows engineering rework to occur on the intermediate component. Substitution of one intermediate component for another allows quick retrofittability and interconnection to an existing PCB layout of an upgrade device with possibly a dissimilar pinout from that of the original device.

To aid redistribution through signal lines, the vias are connected through variable length trace elements extending between the terminal ends of each via and a bonding pad or bond location. The bond locations are surface mount locations formed according to surface mount techniques. The bond locations are arranged adjacent the die for receiving the bond wire extending from the die. The bond locations are therefore densely patterned similar to the dense circuitry arranged upon the die. By offsetting vias from bond locations, a fan out is achieved whereby the trace elements arranged therebetween connect densely patterned bond locations to respective, sparsely patterned vias. Sparsely patterned conductive paths terminating as sockets and pins thereby enjoy the benefits of plug and socket retrofittability, while bond locations connectable thereto and densely arranged in registry with die circuitry enjoy the benefits of surface mount density. The benefit of combining these two interconnect structures in a stackable laminated module thereby provides an advantageous, flexible interconnect system.

BRIEF DESCRIPTION OF THE DRAWINGS

Other objects and advantages of the invention will become apparent upon reading the following detailed description and upon reference to the accompanying drawings in which.

Figure 1:
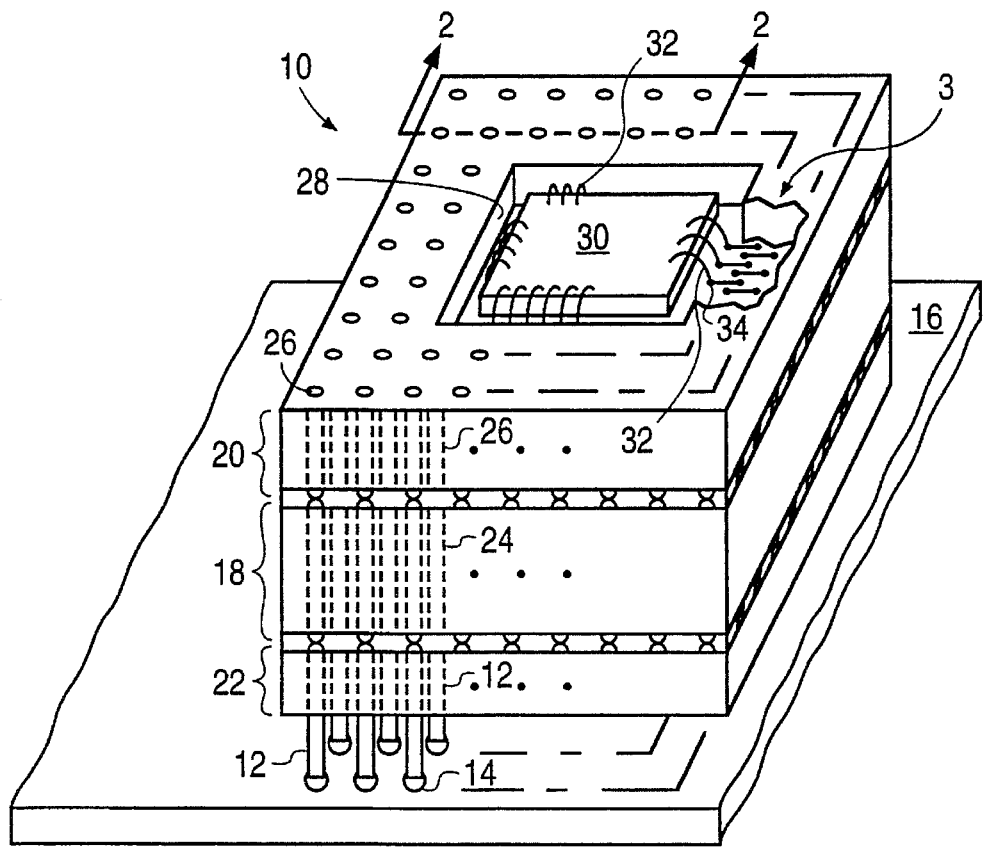
FIG. 1 is a perspective view of an laminated module having pins placeable into a PCB and sockets adapted for receiving pins of another laminated module according to a stacked interconnect system of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular forms disclosed, but on the contrary, the intention is to cover all modifications, equivalents and alternatives falling within the spirit and scope of the present invention as defined by the appended claims.

DETAILED DESCRIPTION OF THE INVENTION

Turning now to FIG. 1, an laminated module 10 is shown having pins 12 adapted for placement into into sockets 14 of PCB 16. Pins 12 and sockets 14 are dimensioned to frictionally engage each other during insertion. Upon engagement, pins 12 electrically couple with sockets 14. Conversely, pins 12 can be releaseably removed from sockets 14 by force extraction. Pins 12 are electrically connected to a plated cylindrical conductor of sockets 14. At least some if not all of the plated sockets 14 are connected to printed wires arranged upon or within PCB 16.

Laminated module 10 preferably includes three separate cards which can be bonded together to form a unibody structure. Laminated module 10 thereby includes an intermediate component 18 capable of being fixedly secured between female component 20 and male component 22. Male component 22 is made of a dielectric structure having a spaced plurality of pins 12 extending therethrough from one side of male component 22 to the opposing side and beyond. The terminating points of pins 12 at the upper surface of male component 22 extend slightly beyond the upper surface and are in registry with terminating ends of vias 24 (shown in phantom) within intermediate component 18. Continuing the conductive path, vias 24 terminate slightly above the upper surface of intermediate component 18 and are in registry with sockets 26 (shown in phantom) within female component 20.

The conductive path formed by longitudinal alignment of pins 12 to vias 24 and to sockets 26 is completed by contacting at least some of the termination points of pins 12, vias 24 and sockets 26 with solder using suitable reflow methods. Once pins 12, vias 24 and sockets 26 are connected, an array of conductive paths are formed which extend in spaced relation to one another between opposite surfaces of laminated module 10. One of the opposite surfaces having an array of pins 12 extending therefrom, and the other of the opposite surfaces having sockets 26 longitudinally aligned with pins 12. Sockets 26 within laminated module 10 are plated with a conductive metal, preferably using an electroless process. A preferred plating material includes copper, however, other conductive materials are suitable. Sockets 26 within laminated module 10 are thereby formed of the same dimension and configuration as sockets 14 within PCB 16.

Female component 20 has an outside dimension preferably equal to that of intermediate component 18 and male component 22. A hole extends entirely through female component 20 bounded by inside walls 28. Inside walls 28 are dimensioned about an area upon which a non-packaged electrical device 30 is placed. Device 30 comprises a die having electrical circuitry placed on the upper topography of the die. At select termination points of the circuitry, wires 32 are coupled extending from device 30 to bond locations 34. Device 30 is secured to the upper surface of intermediate component 18, and is surrounded by inner walls 28 of female component 20. The thickness of female component 20 is defined as the length necessary for sockets 26 to receive mating pins from another laminated module to be described in reference to FIG. 2.

Figure 2:
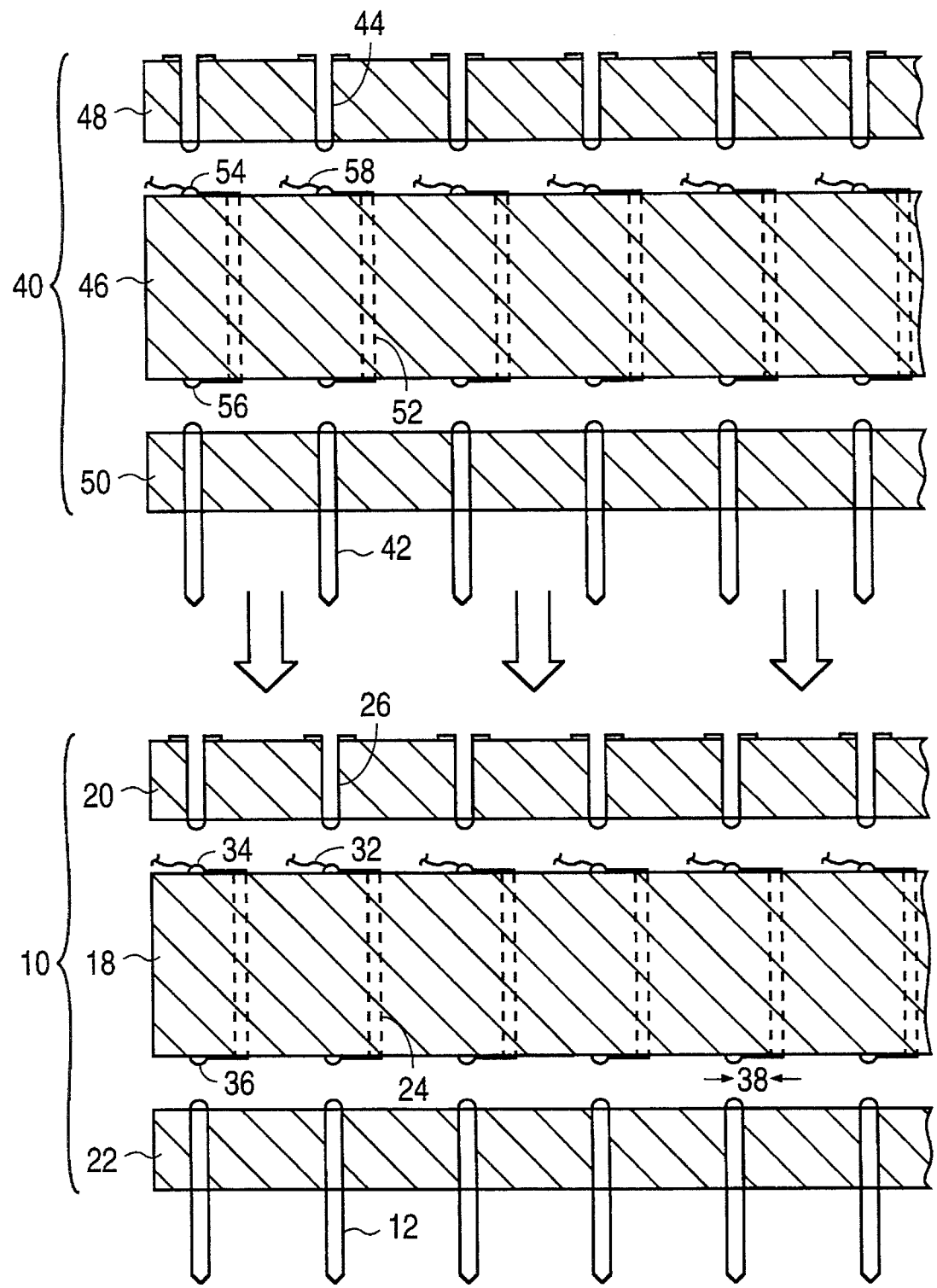
FIG. 2 is a breakaway cross-sectional view along plane 2—2 of FIG. 1 with another laminated module in cross-section placeable thereon.

Turning now to FIG. 2, laminated module 10 is shown in a breakaway cross-section along plane 2—2 of FIG. 1. Specifically, laminated module 10 includes separate male component 22, intermediate component 18 and female component 20. Placed on the upper surface of intermediate component 18 is a series of bond locations 34. Bond locations 34 are preferably shaped in a half sphere of circular cross-section. Each bond location is made of a conductive material coated with a solder such as lead, tin or a mixture of each. Each bond location is therefore adapted to receive a wire 32 soldered thereto. Each bond location is further adapted to receive a solder connection to abutting ends of upper sockets 26. The bond locations at the lower surface of intermediate component 18 are defined as bonding pads 36 adapted for solder connection to abutting termination ends of pins 12. When soldered together, pins 12 are electrically coupled to vias 24 and sockets 26 to form a conductive path extending entirely through laminated module 10. As understood hereinbelow, sockets 26 and vias 24 are plated with conductive material necessary to construct the conductive path with conductive pins 12.

The conductive path extends along a longitudinal axis, wherein vias 24 are offset from the longitudinal axis in accordance with an offset position 38. Offset position 38 can vary in magnitude depending upon the amount of redistribution necessary to move bonding pad locations inward toward device 30 and away from vias 24 dimensioned preferably larger than bond locations 34 or bonding pads 36. Offset 38 is necessary to redistribute closely spaced, surface mounted bonding locations/pads 34/36 to more sparsely spaced vias 24.

Further reference to FIG. 2 illustrates a second laminated module 40 having pins 42 extending from one surface and sockets 44 extending into an opposed second surface. Pins 42 are dimensioned equal to pins 12 of first laminated module 10 for frictional engagement and electrical connectivity within sockets 26. Second laminated module 40 is of equivalent configuration to that of first laminated module 10, having an intermediate component 46 coupled between female component 48 and male component 50. Intermediate component 46 includes opposed surfaces having vias 52 extending therethrough to termination points connected to and offset from bond locations 54 and bonding pads 56. Wires 58 connect between bond locations 54 and a second device (not shown). Accordingly, circuitry of the second device is coupled through second conductive paths formed within the second laminated module 40 to first conductive paths formed within first laminated module 10. Additionally, the first and second devices and circuitry associated therewith are coupled in a stacked configuration to PCB 16, as shown in FIG. 1.

To further clarify, each intermediate component (18, 46, etc.) includes opposite first and second sides with a plurality of spaced first vias extending therethrough. The first vias terminate at positions offset from bonding pads (36, 56, etc.) at the lower surface and bonding locations (34, 54, etc.) at the upper surface. The female component has third and fourth opposite sides with a plurality of spaced second vias extending through the female component and terminating at the third side as openings and the fourth side as female component bonding pads. The male component includes fifth and sixth opposite sides with a plurality of spaced third vias extending through the male component to terminating points at the sixth side as pins and the fifth side as male component bonding pads. The female component bonding pads, male component bonding pads and intermediate component bonding pads/bond locations are in registry with each other and are coupled with a reflow solder technique to interconnect one or more stacked electrical devices to PCB 16.

Figure 3:
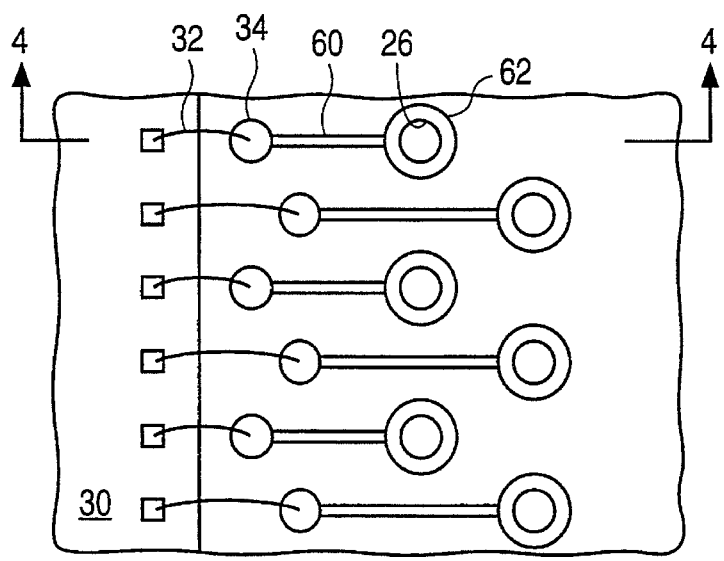
FIG. 3 is a partial breakaway view of area 3 of FIG. 1.

Turning now to FIG. 3, a partial breakaway view in enlarged detail of area 3 of FIG. 1 is shown. Arranged proximate to the edge of device 30 is a series of bond locations 34 configured on the upper surface of intermediate component 18. Bond locations 34 are connected to respective circuitry upon the upper surface of the die using wires 32. Offset from bond location 34 and electrically connected by trace elements 60 are a plurality of via terminating points 62. Trace elements 60 can be of varying length depending upon the amount of offset necessary to reconfigure densely patterned bond locations 34 to sparsely patterned vias 26. Vias 26 are metallically lined or plated using PTH techniques and interconnected to bond locations 34 by interstitial electrically conductive surface traces 60. Bond locations 34 are placed as close to the edge of device 30 as possible in order to minimize noise susceptibility of exposed wires 32.

Figure 4:
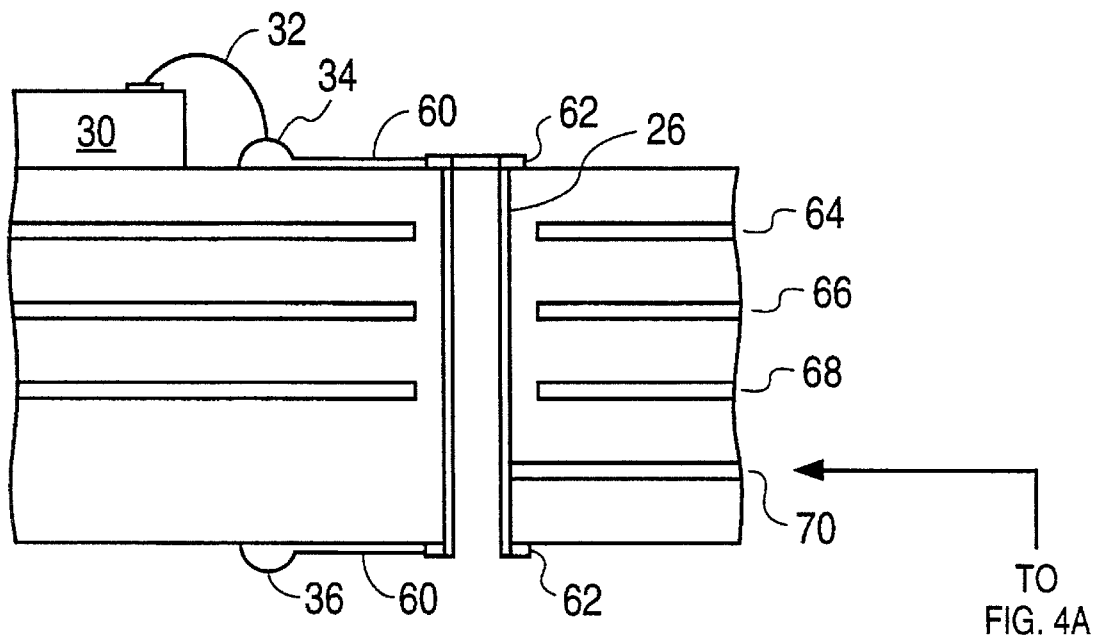
FIG. 4 is a cross-sectional view along plane 4—4 of FIG. 3.
Figure 4A:
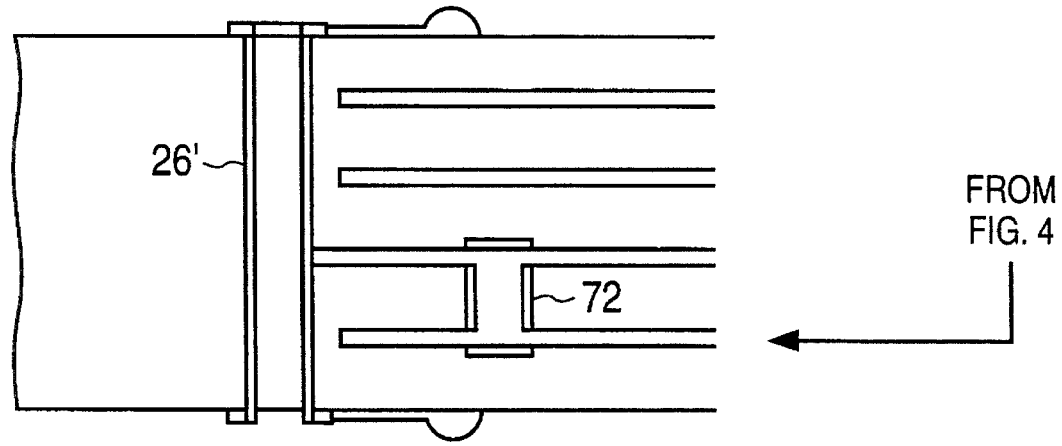
FIG. 4a is a cross-sectional view of an intermediate component showing rework signal lines connected to signal lines within FIG. 4.

Turning now to FIG. 4, a cross-sectional view along plane 4—4 of FIG. 3 is shown. FIG. 4 illustrates the metallically lined via 26 electrically connected at the opposed surface layers by trace elements 60 to bond location 34 and bonding pad 36. Trace elements 60 provide redistribution from bond location 34/bonding pad 36 to via 26. Additional redistribution can occur within the multilayered intermediate component (18, 46, etc.). The intermediate component preferably includes several levels comprising, for example, power and ground planes 64 and 66, respectively. Planes 64 and 66 can provide suitable decoupling of signals sent through vias 26 or through signal lines 68 and 70. Signal lines 68 and 70 thereby provide redistribution from one via 26 to another via 26', as shown in FIG. 4a. As arrow 72 indicates, a signal line 70 arranged within a coplanar series of signal lines can be routed across the laminated module from one via 26 to another via 26'. There may be instances in which it is necessary to couple a signal line at one level to another signal line at another level, such as between signal lines 70 and 68. Connection between signal lines can occur either through a plated-through hole (via) or through a buried via 72.

The combination of multilevel signal lines, buried vias and plated-through hole vias allows for fan-out of densely patterned bond locations 34 to non-densely patterned via locations 26'. Accordingly, vias 26 and 26' extend entirely through the intermediate component and connect to pins 12, shown in FIG. 1, to form a pin grid array (PGA) type connector for plugging into sockets 14 upon PCB 16. The male component is therefore configured having pins extending from a single side, similar to an array of pin within a PGA. The PGA configuration is repeated through mating sockets 26 on female component 20.

It will be appreciated to those skilled in the art having the benefit of this disclosure that this invention is capable of applications with numerous types of surface mount electrical devices placed on laminated modules in a stacked configuration. It is understood that more than one electrical device can be configured upon each laminated module, and the configuration repeated to form an array of devices arranged in a three dimensional fashion upon the PCB. Furthermore, it is to be understood that the form of the invention shown and described is to be taken as presently preferred embodiments. Various modifications and changes may be made without departing from the spirit and scope of the invention as set forth in the claims. It is intended that the following claims be interpreted to embrace all such modifications and changes and, accordingly, the specification and drawings are to be regarded in an illustrative rather than a restrictive sense.

What is claimed is:

1. A laminated module comprising:

an intermediate component having first and second opposite sides, said intermediate component having a plurality of spaced first vias extending through said intermediate component and terminating at the first and second opposite sides at a position offset from a plurality of intermediate component bonding pads electrically connected therewith;

a female component having third and fourth opposite sides, said female component having a plurality of spaced second vias extending through said female component and terminating at the third side as sockets and the fourth side as female component bonding pads in registry with the plurality of intermediate component bonding pads upon the intermediate component first side;

a male component having fifth and sixth opposite sides, said male component having a plurality of spaced third vias extending through said male component and terminating at the sixth side as pins and the fifth side as male component bonding pads in registry with the plurality of intermediate component bonding pads upon the intermediate component second side;

an area upon the first side of said intermediate component adapted for receiving an integrated circuit having electrical wires extending from said integrated circuit to said intermediate component bonding pads; and wherein said intermediate component bonding pads, said female component bonding pads and said male component bonding pads each include a solder coating that, when one solder coated bonding pad is placed in registry and engaged with another solder coated bonding pad and thereafter heated, allows said bonding pads permanent fixture to one another.

2. The laminated module as recited in claim 1, wherein said intermediate component comprises a plurality of dielectric layers interlaced between a plurality of conductive layers, said dielectric and conductive layers extending generally parallel to said first and second opposite sides.

3. The laminated module as recited in claim 2, wherein at least one said conductive layer comprises coplanar, spaced conductive traces extending between, and in electrical contact with, at least two said first vias.

4. The laminated module as recited in claim 1, wherein said first vias are drill holes plated with a conductive metal.

5. The laminated module as recited in claim 1, wherein said intermediate component bonding pads, said female component bonding pads, said male component bonding pads, and said first, second and third vias are each of circular cross-section.

6. The laminated module as recited in claim 1, wherein said intermediate component bonding pads, said female component bonding pads and said male component bonding pads are each of equal cross-section diameter dissimilar than the cross-section diameter of said first, second and third vias.

7. The laminated module as recited in claim 1, wherein the solder coated bonding pads, when heated, provides permanent connection of said intermediate component, said female component and said male component with one another to form a unibody structure.

8. The laminated module as recited in claim 7, wherein said unibody structure comprises opposite sides with said pins on one side and said sockets on the opposite side, said pins and sockets are dimensioned to frictionally mate with another unibody structure formed according to claim 8.

* * * * *